(12) United States Patent
Chen

(10) Patent No.: US 6,188,607 B1
(45) Date of Patent: Feb. 13, 2001

(54) INTEGRATED CIRCUIT MEMORY HAVING DIVIDED-WELL ARCHITECTURE

(75) Inventor: Chun Chen, Bedminster, NJ (US)

(73) Assignee: Lucent Technologies Inc., Murray Hill, NJ (US)

( * ) Notice: Under 35 U.S.C. 154(b), the term of this patent shall be extended for 0 days.

(21) Appl. No.: 09/366,978

(22) Filed: Aug. 4, 1999

(51) Int. Cl.$^7$ ................................................. G11C 16/04
(52) U.S. Cl. ............................. 365/185.18; 365/185.27
(58) Field of Search ...................... 365/185.18, 185.01, 365/185.27, 185.28; 257/901

(56) References Cited

U.S. PATENT DOCUMENTS

| | | | |
|---|---|---|---|
| 4,878,199 | * 10/1989 | Mitzutani | 365/185.01 |
| 6,025,621 | * 2/2000 | Lee et al. | 257/296 |

\* cited by examiner

*Primary Examiner*—David Nelms
*Assistant Examiner*—David Lam
(74) *Attorney, Agent, or Firm*—William S. Francos

(57) ABSTRACT

An integrated circuit has a memory array comprising memory devices formed in a multiplicity of electrically isolated semiconductor regions that share a common set of bit lines. A given semiconductor region, typically a tub, is biased to a given voltage if a memory cell formed in that tub is accessed for a write operation, and biased to another voltage at other times. Although there may be many memory devices along the same bit line, during programming only the memory devices in the selected tub will be disturbed by the tub bias. Other memory devices residing in unselected tubs are protected against the bit line disturb. The present technique is especially advantageous when used with flash EEPROM memory cells that utilize secondary electron injection to assist in programming the cells.

4 Claims, 2 Drawing Sheets

1

INTEGRATED CIRCUIT MEMORY HAVING DIVIDED-WELL ARCHITECTURE

BACKGROUND OF THE INVENTION

1. Field of the Invention

The present invention relates to an integrated circuit having memory cells.

2. Description of the Related Art

Electrically programmable read-only memories (EEPROMs) are used in a variety of applications where non-volatile memory operation is desired. In particular, the so-called "flash" EEPROM has gained favor in recent years due to the ease of erasing an entire array of information at one time, which reduces the time required to re-program the information in the memory. In particular, secondary electron injection has been invented by J. Bude et al as a low power and scaleable programming method for flash EEPROM memory; see, for example, U.S. Pat. No. 5,659,504 co-assigned herewith and incorporated herein by reference.

An illustrative EEPROM according to the teachings of that patent is depicted in FIG. 1. The EEPROM in FIG. 1 has the stacked gate structure of a double-polysilicon MOSFET (metal-oxide-semiconductor field effect transistor). The EEPROM in FIG. 1 has a semiconductor region 100, source region 110, drain region 120, channel 130, floating gate 140, and control gate 160 found in conventional EEPROMs. The floating gate 140 is a layer of polysilicon isolated from the semiconductor region 100 and the control gate 160 by a first layer of silicon dioxide 150 and a second layer of silicon dioxide 170, respectively. The first layer of silicon dioxide 150 is sufficiently thin, i.e. about 100 Angstroms or less, for electrons to pass therethrough by either Fowler-Nordheim (FN) tunneling or by hot electron injection. The semiconductor region 100 is typically a tub region of a given conductivity type formed in an underlying doped region (not shown), typically another tub of the opposite dopant type, formed in an underlying wafer substrate (also not shown) of the given conductivity type. Other details of operation and embodiments may be found in the above-noted patent.

An array of memory cells is arranged in rows and columns, with the rows typically viewed horizontally and the columns vertically. A row conductor is usually referred to as a "word line", and activates the memory cell for storing (i.e., writing) or retrieving (i.e., reading) information to or from the cell. In a typical case, the word line is connected to the gate of a field effect transistor, which device may itself provide for storing the information, or may provide access to another device used for storing information. The column conductor is usually referred to as a "bit line", and typically connects to the drain of a field effect transistor for transferring electrical charge into the storage element (i.e., writing), or retrieving charge from the storage element (i.e., reading), after the transistor is accessed by the word line. Comparable connections are made when bipolar memory devices are used rather than field effect devices.

Because the devices of the above-noted U.S. patent utilize the drain-tub bias to affect electron injection into the tub, the devices can be selectively enabled or disabled by varying the tub voltage to a device or a particular sub-array of devices. For example, in an array of EEPROM cells depicted in FIG. 6 of that patent, the array is divided into two sub-arrays. The tub connections to a particular sub-array are commonly connected to a sub-array select line. The sub-array select lines are isolated from each other and consequently, the tub voltage in one sub-array is capable of being modulated differently from the tub voltage in other sub-array. The devices of the above-noted patent may be programmed only when the tub voltage is −0.5 V or more negative. Therefore, a cell in a particular sub-array can be deselected by raising the tub voltage to the sub-array (i.e., make it more positive with respect to the substrate) in which the cell to be deselected is found. Further details of operation may be found in the above-noted patent. However, note that the sub-arrays share common word lines that run from one sub-array to another. For the purpose of selecting and deselecting along the bit line direction, different word line biases are sufficient.

The "bit line disturb" of a memory cell refers to the disturbance of non-accessed memory cells along a given bit line when one of the cells on the bit line is accessed for a write operation. In particular, non-volatile memory cells should have as large a margin against bit line disturb as possible, since the information is typically not refreshed in the cell, and may need to be maintained for lengthy periods. Recent test results have shown that the bit line disturb margin of EEPROM cells that use secondary electron programming is less than that of EEPROM cells using conventional channel hot-electron injection. Existing methods to reduce bit line disturb include organizing a big array into many smaller separated sub-arrays or making use of divided-bit line architecture, but in both ways the required additional decoding adds considerable amount of complexity and area to the memory array.

SUMMARY OF THE INVENTION

I have invented an integrated circuit having a memory array comprising memory devices formed in a multiplicity of electrically isolated semiconductor regions that share a common set of bit lines. A given semiconductor region, typically a tub, is biased to a given voltage if a memory cell formed in that tub is accessed for a write operation, and biased to another voltage at other times. The present technique is especially advantageous when used with flash EEPROM memory cells that utilize secondary electron injection to assist in programming the cells.

DETAILED DESCRIPTION

Figure 1:
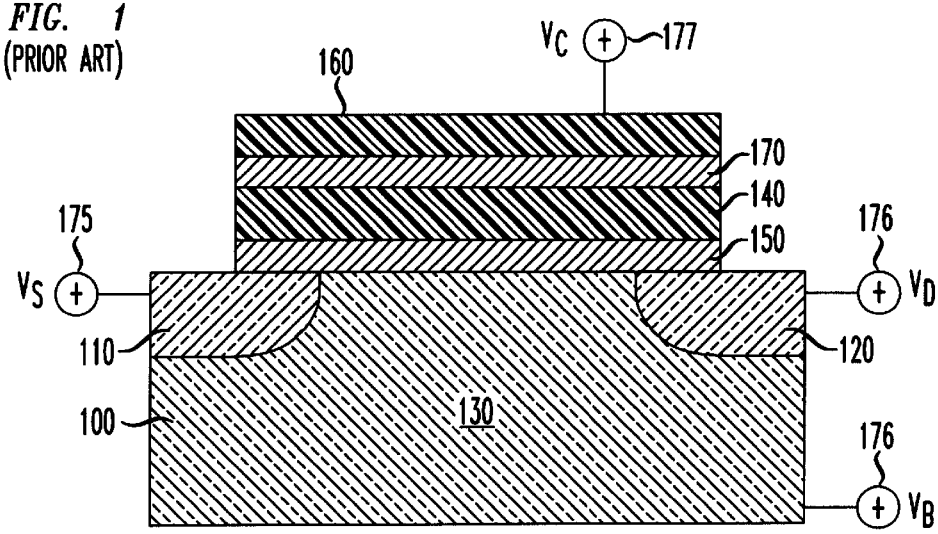
FIG. 1 shows an embodiment of a prior-art flash EEPROM memory cell in a tub.
Figure 2:
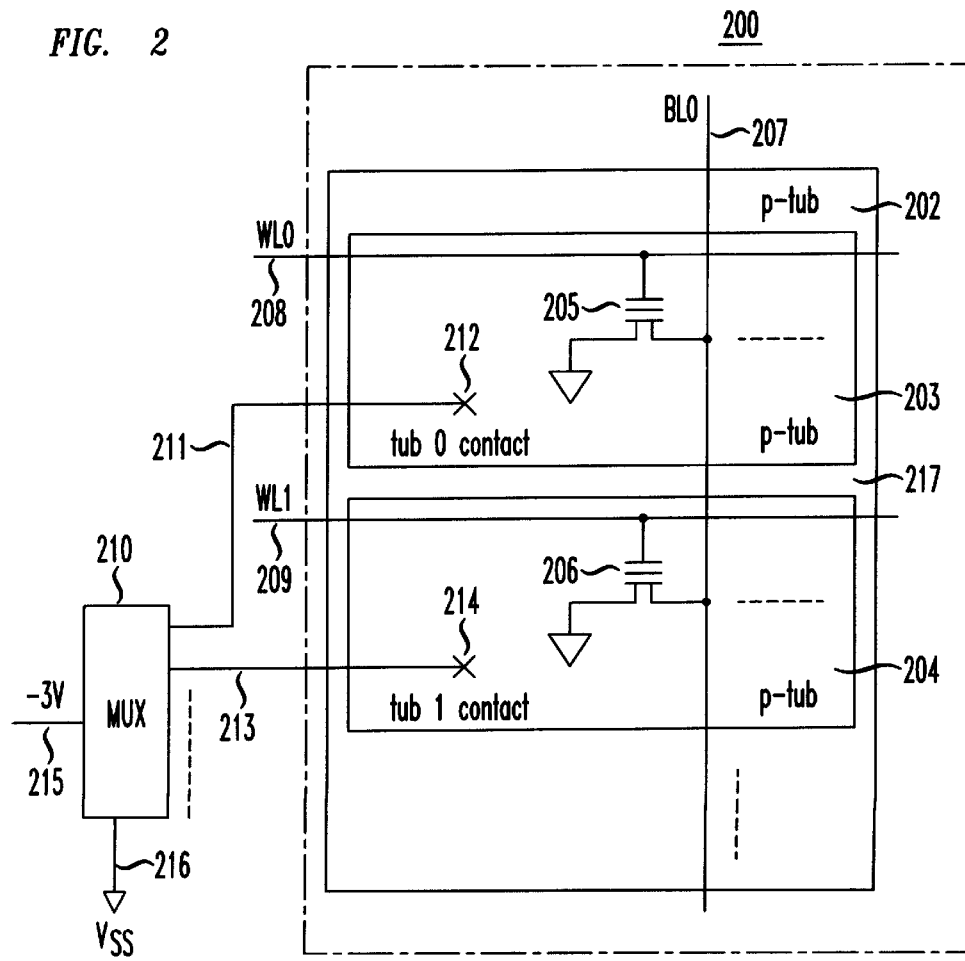
FIG. 2 shows an array of flash EEPROM memory cells in multiple tubs that share bit lines.

The following detailed description relates to an integrated circuit having a memory array comprising memory devices formed in at least two electrically isolated semiconductor regions that share a common set of bit lines. The electrically isolated regions are illustratively "tubs", also referred to as "wells" in the art. Referring to FIG. 2, an integrated circuit 200 is formed in a p-substrate 201, and the memory array is formed in an n-tub 202 formed in the substrate 201. A first group of memory cells, illustratively including cell 205, is formed in a first p-tub 203, and a second group of memory cells, illustratively including cell 206, is formed in a second p-tub 204, with both p-tubs being formed in the underlying n-tub 202. It can be seen that the p-tubs are separated by a region 217 of the underlying n-tub 202 that reaches the top surface of the silicon wafer in which the tubs are formed. The memory cells are accessed for read and write operations via a bit line BL0, being column conductor 207, which extends from the cells in the first group to the cells in the second group, and passes over the region 217 that separates the tubs 203 and 204. In addition, the memory cells are accessed by word lines WL0 (row conductor 208) and WL1 (row conductor 209). It will be understood that column decoders (not shown) activate the bit lines, and row decoders (not shown) activate the word lines, according to principles known in the art.

In order to access a memory cell within a given one of the first and second groups, the word line is biased to $V_{dd}$, and the p-tub in which that group is located is biased to the appropriate voltage 215 for the type of memory cell used, being −3 volts in the illustrative case. This is accomplished by a multiplexer 210 that selectively routes the bias voltage to either line 211 when tub 203 is selected, or alternatively line 213 when tub 204 is selected. The conductive lines 211 and 213 electrically contact the tubs through highly doped (p+) tub-tie regions 212 and 214, respectively. The non-selected tub is biased at a different potential 216, being ground (e.g., 0 volts) in the illustrative case, which is chosen to reduce the disturbance of the memory cells in the non-selected group.

In a typical implementation of the inventive technique, the p-tub that forms each group includes 64 word lines. Therefore, although there could be, for example, 512 flash EEPROM memory devices along the same bit line, during programming only 64 of them in the selected tub will be disturbed by the negative well bias (e.g., −3 volts). The other cells residing in unselected (e.g., grounded) tubs are protected against the bit line disturb. Depending on the number of tubs provided per bit line, the program disturb margin can be improved by orders of magnitude. Furthermore, the additional circuits (e.g., multiplexer) needed for tub decoding is minimal in comparison with the divided-bit line architecture used in the prior art.

Figure 3:
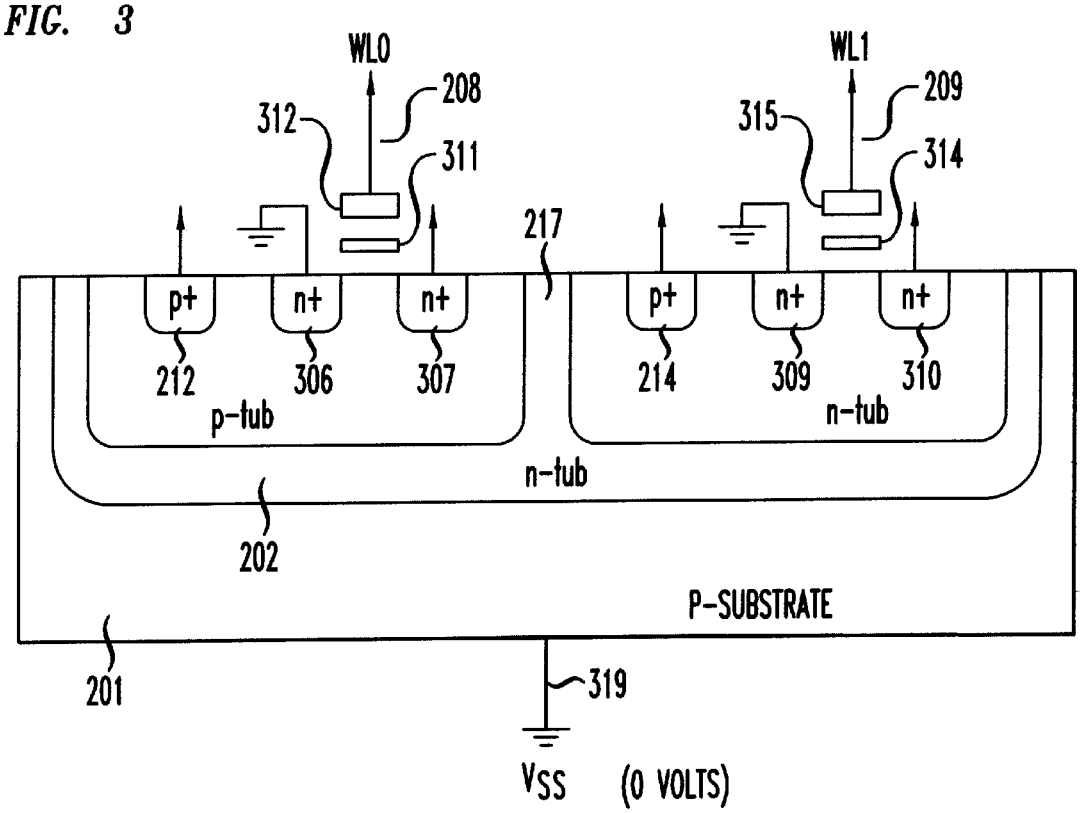
FIG. 3 shows a cross-section of the array of FIG. 2.

Referring to FIG. 3, a cross-section view of an integrated circuit that implements the memory array of FIG. 2 is shown, with like elements being numbered with the same reference number. The various dielectric layers overlying the surface of the substrate and isolating the gates and other conductive regions are not shown for clarity. The p-substrate 201 has formed therein an n-tub 202, which has formed therein p-tubs 203 and 204 separated by n-tub region 217. The p-n junction between the p-tubs and the n-tub electrically isolates the p-tubs from each other when the p-tubs are biased negatively with respect to the n-tub. In each p-tub are formed the memory cells of the respective groups. For example, in p-tub 203 is formed an illustrative EEPROM floating gate cell comprising source region 306, drain region 307, floating gate 311 and control gate 312. Similarly, in p-tub 204 is formed an EEPROM cell comprising source region 309, drain region 310, floating gate 314 and control gate 315. It can be seen that the sources are connected to ground (0 volts), and the drains are connected though drain contacts to the same column conductor 207. The control gates are connected through the gate contacts to separate row conductors 208 and 209. In addition, the p-tub 203 is connected to the tub select line 211 via the p+ tub-tie 212, and the p-tub 204 is connected to the tub select line 213 via the p+ tub-tie 214.

The above description has been illustratively given in terms of a single array having memory devices formed in different tubs that may be accessed separately. However, multiple arrays, each having its own row decoder and column decoder, may also be implemented on a single integrated circuit, with each of the arrays utilizing multiple tubs according to the inventive technique. Various techniques utilizing divided bit lines and/or divided word lines may also be implemented in conjunction with the present technique, if desired, as for speeding up the accessing of memory cells or for further reducing bit line disturb, or for other purposes. Furthermore, it is apparent that the technique described above may be used to reduce the disturbance generated by accessing a given bit line regardless of the type of memory cell being accessed. That is, memory arrays having various other types of non-volatile memory cells, including various forms of stored-charge cells, ferroelectric, opto-electric and other types may benefit from the reduced disturb margins provided herein. While specific voltage levels and polarities are described above, it will be apparent that the appropriate values depends on the type of memory cell being accessed and various other factors related to the design and operation of the integrated circuit.

As illustrated above, the semiconductor region in which the memory cells are formed are doped tub regions isolated from each other by the semiconductor junctions between the tub and the underlying semiconductor region of the opposite dopant type. However, the use of dielectric isolation (e.g., silicon dioxide, silicon nitride, etc.) may be used in addition to, or in lieu of, junction isolation. Also, the semiconductor regions in which the memory cells are formed may in fact be deposited regions, rather than regions formed in an underlying semiconductor substrate. While two adjacent tub regions are illustrated herein, it is apparent that the common bit lines may be extended to run across more than two semiconductor regions. It can be seen that the advantages of the reduced bit line disturb obtained with the appropriate biasing may be obtained in these and still other cases.

What is claimed is:

1. An integrated circuit comprising:

memory cells arranged in rows accessed by word lines and columns accessed by bit lines;

a first group of said memory cells formed in a first semiconductor region, and a second group of memory cells formed in a second semiconductor region that is electrically isolated from said first semiconductor region, wherein said bit lines run between said first group and said second group, and wherein a selected one of said first and second semiconductor regions is biased by a given voltage when a cell in a group formed in said selected region is accessed for a write operation, and biased at a voltage different than said given voltage when no cell in said selected region is accessed for a write operation; and a multiplexer that selectively connects a source of said given voltage to a selected one of said first and said second semiconductor regions.

2. The integrated circuit of claim 1 wherein said memory cell is an EEPROM cell.

3. The integrated circuit of claim 2 wherein information is stored in said EEPROM cell with the assistance of secondary electron injection.

4. The integrated circuit of claim 1 wherein said first semiconductor region and said second semiconductor regions are tub regions of a given doping type formed in an underlying semiconductor region of the opposite doping type.

* * * * *